(12) United States Patent
Cooney et al.

(10) Patent No.: US 11,936,347 B2
(45) Date of Patent: Mar. 19, 2024

(54) SYSTEMS AND METHODS FOR DRIVING SEMICONDUCTOR DEVICES AND SENSING DEVICE PARAMETERS

(71) Applicant: EPIRUS, INC., Hawthorne, CA (US)

(72) Inventors: Padraig James Cooney, Palos Verdes, CA (US); Denpol Kultran, Torrance, CA (US); Ronald Chang, San Jose, CA (US); Harry Bourne Marr, Jr., Manhattan Beach, CA (US)

(73) Assignee: Epirus, Inc., Torrance, CA (US)

( * ) Notice: Subject to any disclaimer, the term of this patent is extended or adjusted under 35 U.S.C. 154(b) by 0 days.

(21) Appl. No.: 17/839,306

(22) Filed: Jun. 13, 2022

(65) Prior Publication Data

US 2022/0399859 A1   Dec. 15, 2022

Related U.S. Application Data

(60) Provisional application No. 63/210,482, filed on Jun. 14, 2021.

(51) Int. Cl.
| | | |
|---|---|---|
| *H03F 3/195* | (2006.01) | |
| *H03F 3/45* | (2006.01) | |
| *H03M 1/12* | (2006.01) | |
| *H03M 1/46* | (2006.01) | |

(52) U.S. Cl.
CPC ......... *H03F 3/195* (2013.01); *H03F 3/45475* (2013.01); *H03M 1/1245* (2013.01);
(Continued)

(58) Field of Classification Search
CPC ................ H03F 3/195; H03F 3/45475; H03F 2200/372; H03F 2200/451; H03F 2200/462; H03F 2203/45528; H03F 3/16; H03F 2201/3203; H03F 1/32; H03F 1/523; H03F 3/189; H03F 3/19; H03F 3/45179;
(Continued)

(56) References Cited

U.S. PATENT DOCUMENTS

| | | | |
|---|---|---|---|
| 7,102,335 B1 * | 9/2006 | Solie | G11C 5/141 323/273 |
| 7,522,082 B2 | 4/2009 | Asayama et al. | |

(Continued)

FOREIGN PATENT DOCUMENTS

| | | |
|---|---|---|
| EP | 3599719 | 1/2020 |
| WO | WO 2022/266009 | 12/2022 |

OTHER PUBLICATIONS

International Search Report and Written Opinion issued in PCT/US2022/033295 dated Sep. 16, 2022.
(Continued)

*Primary Examiner* — Jung Kim
(74) *Attorney, Agent, or Firm* — Knobbe, Martens, Olson, & Bear, LLP

(57) ABSTRACT

An application specific integrated circuit (ASIC) can drive semiconductor devices, such as, radio frequency amplifiers, switches, etc. The ASIC can include a supply and reference voltage generation circuit, a digital core, a clock generator, a plurality of analog-to-digital converters, low and high-speed communications interfaces, drain and gate sensing circuits (that can include one or more current sense amplifiers), and a gate driver circuit. The ASIC can be a low voltage semiconductor integrated circuit.

20 Claims, 13 Drawing Sheets

(52) U.S. Cl.
CPC ....... *H03M 1/462* (2013.01); *H03F 2200/372* (2013.01); *H03F 2200/451* (2013.01); *H03F 2200/462* (2013.01)

(58) Field of Classification Search
CPC ............. H03F 3/45479; H03F 2200/18; H03F 2203/45008; H03M 1/1245; H03M 1/462; H03M 1/46; H02M 1/08; G11C 7/062; H03K 3/023; H03K 19/08
See application file for complete search history.

(56) References Cited

U.S. PATENT DOCUMENTS

| | | |
|---|---|---|
| 9,455,695 B2 | 9/2016 | Kull et al. |
| 2004/0263233 A1 | 12/2004 | Dupuy |
| 2006/0133550 A1 | 6/2006 | Bolton |
| 2017/0070199 A1 | 3/2017 | Anderson |

OTHER PUBLICATIONS

5G GaN FEM Power Management Controller Supply :- 6V(Optional), +5V, MABC-11050B, Rev. V3, MACOM, 108 pgs.

12A rated uPOL™ Buck Regulator with Integrated Inductor and Digital Power System Management, TDK Datasheet, Rev 2.5, Jul. 27, 2022, in 39 pages.

CSD95372AQ5M Synchronous Buck NexFET™ Power Stage, Texas Instruments, Jun. 2014, revised Mar. 2015, in 25 pages.

MABC-1140B, Rev V2, Power Management Bias Controller/ Sequencer, Supply :-6V, +5V, MACOM, in 105 pages.

\* cited by examiner

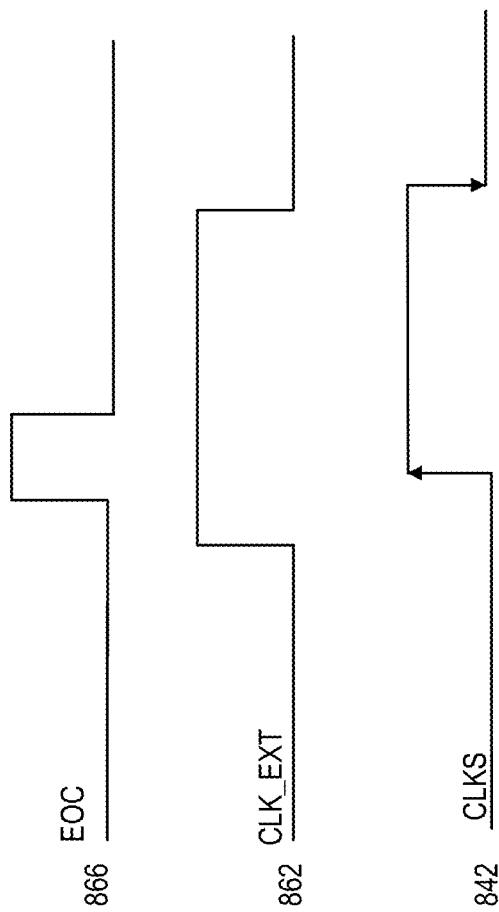

SYSTEMS AND METHODS FOR DRIVING SEMICONDUCTOR DEVICES AND SENSING DEVICE PARAMETERS

CROSS-REFERENCE TO RELATED APPLICATIONS

This application claims priority to U.S. Provisional Patent Application No. 63/210,482, filed on Jun. 14, 2021, which is incorporated by reference in its entirety.

TECHNICAL FIELD

Disclosed are systems and methods for driving semiconductor devices, such as radio frequency (RF) amplifiers.

BACKGROUND

Amplifiers to increase the magnitude of voltage/current/power of an input signal are useful in many analog and digital devices including radio frequency (RF) devices, microwave devices, computers/laptops and cell phones. Output power, efficiency and linearity are some of the important figures-of-merit (FoM) for systems employing amplifiers. Existing driving schemes for many amplifiers (e.g., high power amplifiers) are not designed to optimize multiple figures of merit. Accordingly, driving schemes that can improve various figures-of-merit for amplifiers are advantageous.

Furthermore, the production of high-power RF signals, such as multiple watts for commercial applications and up to Megawatts of radiated power for other applications, typically requires RF amplifiers and other signal processing circuitry that consume large amounts of energy, which may result in large amounts of radiated heat. Consequently, expensively rated circuits and elaborate cooling mechanisms are typically required in such systems. Moreover, the bias voltages/currents required for efficient operation of RF amplifiers in high-power generating RF systems can change with age and/or temperature. Accordingly, there is a need for circuits that can provide appropriate bias voltages/currents to achieve efficient performance of RF amplifiers in high-power generating RF systems.

SUMMARY

Various implementations described herein are directed towards integrated circuit systems and methods to provide bias current and power that would set or change the operating conditions of one or more radio frequency (RF) amplifiers, such as, for example, high power Gallium Nitride (GaN), silicon metal oxide semiconductor field effect transistors (MOSFETs), other III-V devices, or other semiconductor-based RF amplifiers. Various implementations of application specific integrated circuits (ASICs) described herein are configured to provide biasing voltages/currents to turn on/off the amplifiers and/or dynamically adjust the biasing voltages/currents to change the operating conditions of the amplifier.

In some implementations, an integrated circuit (IC) for driving one or more semiconductor devices can include at least one current sense amplifier and a control circuitry. The at least one current sense amplifier can be configured to receive an input signal corresponding to a current flowing through a semiconductor device. The input signal can be associated with a first signal range that exceeds a signal range of a low voltage semiconductor integrated circuit. The at least one current sense amplifier can be configured to convert the input signal to a voltage signal associated with a second signal range. The second signal range can be compatible with the signal range of the low voltage semiconductor integrated circuit. The control circuitry can be configured to process the voltage signal and output a control signal for driving the semiconductor device.

In some implementations, an integrated circuit (IC) for driving one or more semiconductor devices can include an analog front end configured to process an analog input signal received from a semiconductor device and a digital control circuitry. The IC can include an analog to digital converter (ADC) configured to receive the analog input signal from the analog front end and convert the analog input signal to a digital signal. The ADC can include a latch configured to store data used during conversion of the analog input signal to the digital signal. The latch can include first and second switches connected to first and second buffers that can be configured to receive first and second values passed through the first and second switches responsive to the first and second switches being in a closed state. The first and second buffers can be configured to retain the first and second values responsive to the first and second switches being in an open state. At least one of first or second outputs of the first or second buffers can be configured to control a transition of the first and second switches from the closed state to the open state. The digital control circuitry can be configured to process the digital signal and output a control signal for driving the semiconductor device.

In some implementations, an integrated circuit (IC) for driving one or more semiconductor devices can include an analog front end configured to process an analog input signal received from a semiconductor device and a digital control circuitry. The IC can include an analog to digital converter (ADC) configured to receive the analog input signal from the analog front end and convert the analog input signal to a digital signal. The ADC can include a flip-flop configured to store data used during conversion of the analog input signal to the digital signal. The flip flop can include a first transistor controlled by a clock signal. The flip flop can include a second transistor connected to the first transistor and controlled by an input signal. A gate of the second transistor can be configured to be pre-charged when the clock signal is low to reduce a delay in turning on the second transistor and storing the input signal. The flip flop can include a buffer connected to an output of the second transistor. The buffer can be configured to store the input signal. The digital control circuitry can be configured to process the digital signal and output a control signal for driving the semiconductor device.

In some implementations, an integrated circuit (IC) for driving one or more semiconductor devices can include an analog front end configured to process an analog input signal received from a semiconductor device and a digital control circuitry. The IC can include an analog to digital converter (ADC) configured to receive the analog input signal from the analog front end and convert the analog input signal to a digital signal. The ADC can include a clock generator configured to produce an internal clock signal used during conversion of the analog input signal to the digital signal. The clock generator can include a first transistor controlled by a signal produced by the ADC. The clock generator can include a second transistor connected to the first transistor and controlled by an external clock signal. A gate of the second transistor configured to be pre-charged when the signal produced by the ADC is low to reduce a delay in turning on the second transistor and producing the internal clock signal. The internal clock signal can be configured to transition high responsive to detection of a rising edge of the signal produced by the ADC and transition low responsive to detection of a falling edge of the external clock signal. The digital control circuitry can be configured to process the digital signal and output a control signal for driving the semiconductor device.

BRIEF DESCRIPTION OF DRAWINGS

Throughout the drawings, reference numbers may be re-used to indicate correspondence between referenced elements. The drawings are provided to illustrate example embodiments described herein and are not intended to limit the scope of the disclosure.

FIG. 9E illustrates timing diagram of a clock generator of an analog to digital converter, such as that of FIG. 8.

DETAILED DESCRIPTION

Overview

Disclosed herein are implementations of integrated circuits (ICs) that can drive semiconductor devices, such as, radio frequency (RF) amplifiers (for example, high power Gallium Nitride (GaN), silicon metal oxide semiconductor field effect transistors (MOSFETs or FETs), other III-V devices), switches, etc. Driving a semiconductor device can include providing bias current and power that would set or change the operating conditions of the device. In some cases, driving includes adjusting biasing currents/voltages of a semiconductor device based on information obtained about input signal characteristics, output signal characteristics, system operating conditions (such as, operating temperature, operating currents/voltages at various terminals of the amplifier/system, etc.), user inputs, or the like. Additional details of driving semiconductor devices are disclosed in U.S. Pat. No. 11,211,703, which is incorporated by reference in its entirety.

Figure 1:
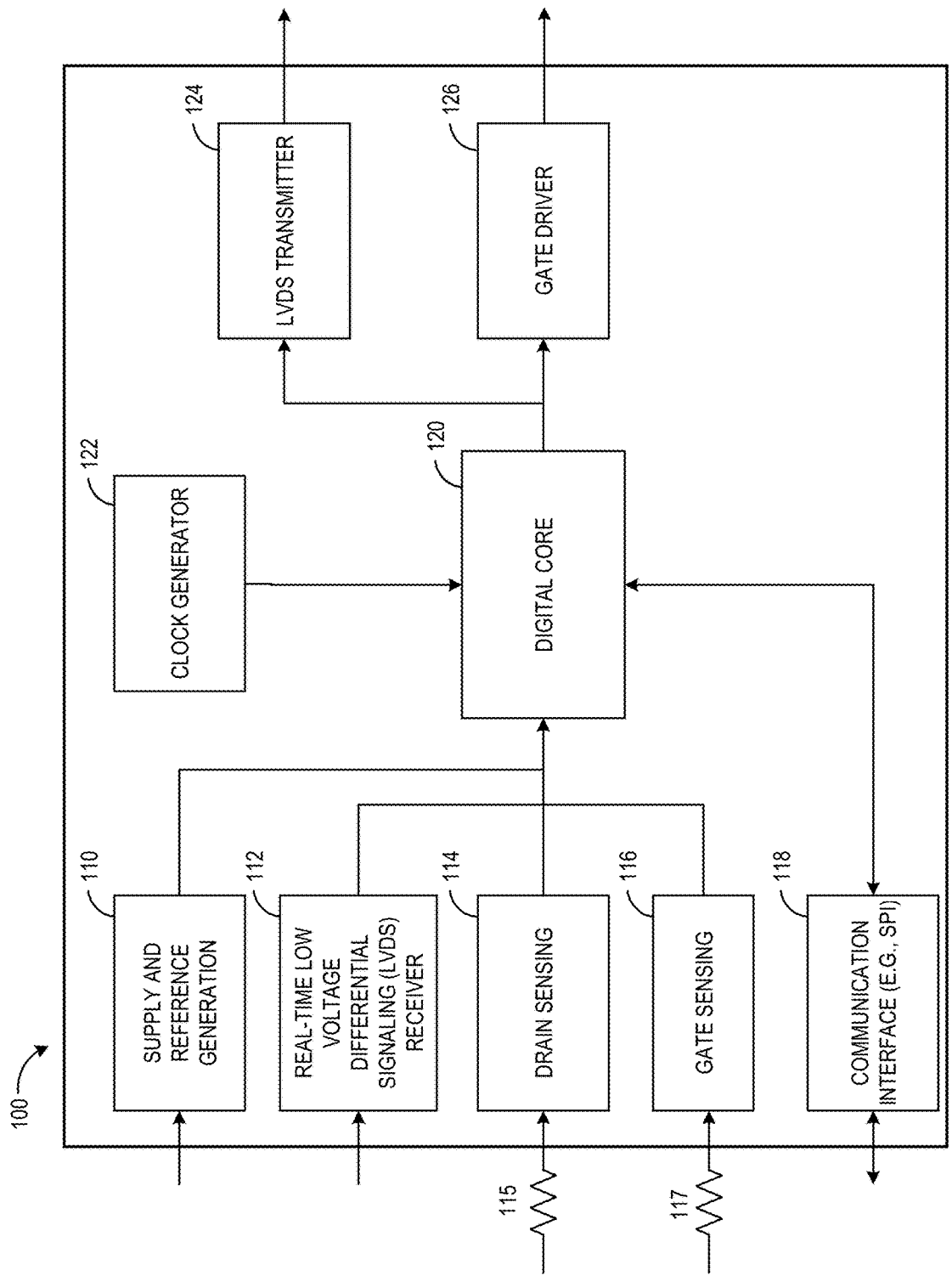
FIG. 1 illustrates an integrated circuit (IC) configured to drive semiconductor devices.

With reference to FIG. 1, in some implementations, an IC 100. The IC can be an application specific integrated circuit (ASIC) that can be used to provide bias power to an amplifier (such as, a high power amplifier). The IC 100 can include a supply and reference voltage generation circuit 110, a digital core 120 (sometimes referred to a processing circuitry), a clock generator for the digital core 120 (and any other component that operates synchronously with a clock signal, such as a communication interface 118), a plurality of analog-to-digital converters (ADCs) (not shown in FIG. 1), real-time receiver and transmitter high-speed communications interfaces (illustrated as a receiver 112 and transmitter 124 that can utilize Low Voltage Differential Signaling (LVDS)), low speed communication interface 118 (which can be a serial peripheral interface (SPI) or another serial or parallel communication interface), drain and gate sensing circuits 114 and 116, and a gate driver circuit 126 for biasing one or more gates of one or more semiconductor devices (such as, a high power amplifier driven by the IC 100). For example, the gate driver circuit 126 can output one or more biasing voltages applied to the one or more gates of one or more semiconductor devices. In some implementations, the IC 100 can additionally or alternatively include a drain driver for biasing one or more drains of one or more semiconductor devices. The IC 100 can be fabricated using a suitable integrated circuit (IC) fabrication process and packaged in an IC package.

As further explained below, the drain sensing circuit 114 can monitor one or more drain currents through one or more semiconductor devices. This can be accomplished by using one or more resistors 115 positioned outside the IC package of the IC 100. The gate sensing circuit 116 can monitor one or more gate currents through one or more semiconductor devices. This can be accomplished by using one or more resistors 117 positioned externally or off-chip, such as outside the IC package of the IC 100. Without any loss of generality, the drain sensing circuit 114 and the gate sensing circuit 116 can be configured to sense the voltage levels at the gate and/or drain terminals of the one or more semiconductor devices in addition to or instead of sensing the current through the gate and/or drain terminals of the one or more semiconductor devices. The digital core 120 can be configured to process information obtained by one or more of drain sensing circuit 114 or gate sensing circuit 116 and operate the gate driver circuit 126 to drive one or more semiconductor devices. More generally, the IC 100 can monitor current, voltage, and temperature of the semiconductor device in normal operating state.

The IC 100 can be configured to be connected to one or more three-terminal semiconductor devices, such as field effect transistors (FETs). The IC 100 can be configured as a sensor and gate modulation ASIC that drives one or more three-terminal semiconductor devices it is connected to and provides information to control the driving voltages to optimize performance of the one or more semiconductor devices with increased precision. The IC 100 can be configured to obtain and use information regarding the one or more semiconductor devices it is connected to and the input and output signals to execute machine learning processes to set optimal operating settings for the one or more semiconductor devices. For example, the digital core 120 of the IC 100 can be configured to employ real-time machine learning and intelligence to improve power efficiency and performance for RF power amplifiers. The digital core 120 can be further configured to use real-time information about the signals to be amplified to control and optimize amplifier driving voltages, gain, bias set points and other features of one or more RF amplifiers controlled by the IC 100.

Design of the ICs described herein (such as, the IC 100) can advantageously provide an IC solution combining a plurality of components that perform different functions in a single chip. In some implementations, an IC (such as, the IC 100) can be configured to perform data capture at high rates, for instance, greater than or equal to 10 mega samples per second (MSPS). The IC can be configured to automatically tune the gate voltage and determine the gate voltage ($V_{off}$) at which the drain current (Id) of a three-terminal semiconductor device starts increasing. Accordingly, unlike systems that design for a specific off-voltage (when the device is off, which can be associated with gate to source voltage, $V_{GS}$, at which the device is turned off), implementations of the ASIC presented herein can autotune the off-voltage. This can reduce the voltage swing required to turn on and turn off the semiconductor device. For example, off-voltage for a GaN device (such as, a GaN power amplifier) can be between −3V and −5V, and on-voltage (when the device is near saturation) can be between −1V and −2.5V. Some current driver systems set the off-voltage to a preset value (for example at −5V for a GaN amplifier) even though the off voltage may be different from the preset value (for example −3V). For such systems, a larger voltage swing (such as, between about 2.5V and 4V) is required to turn on and turn off the semiconductor instead of a smaller voltage swing (such as, between 0.5V and 2V). The larger voltage swing can reduce switching efficiency and/or energy efficiency of operating the semiconductor as well as increase the complexity of the biasing system. However, IC implementations described (such as, the IC 100) herein can identify the lowest magnitude of voltage at which the GaN is still off (for instance, −3V) and thereby reduce the voltage swing required to turn on and turn off the GaN device. For example, if the off-voltage is −3V (and assuming that the on-voltage is between −1V and −2.5V), then the voltage swing required to turn on and turn off the GaN device can be between 500 mV and 1.5V instead of being between 2.5V and 4V.

The IC 100 (or any of the ICs disclosed herein) can be a low-voltage integrated circuit (IC). For instance, the IC 100 can be configured for digital logic levels of 5V or less. In some cases, transistor (TTL) or low voltage complementary metal oxide semiconductor CMOS (LVCMOS) operating voltages can be used. Advantageously, low-voltage ICs can be small, fast, consume less power, be relatively inexpensive to manufacture, and be interoperable with many other devices. The advantage of using a low voltage semiconductor fabrication process is cost, speed and level of integration. In some instances, input signals (such as, drain or gate current) can have high voltage or current. For example, a GaN power amplifier can operate at a drain current of hundreds of milliamperes and voltages of tens or hundreds of volts. As a result, one or more input signals can exceed the maximum operating voltage and current thresholds of a low-voltage IC. As described herein, one or more current sense amplifiers can be configured to convert high voltage or current input signals into signals compatible with low-voltage ICs.

Advantageously, the IC 100 can consume little power. The IC 100 can include one or more (such as, two) analog to digital converters (ADCs) for high resolution gate/drain sensing. The one or more ADCs can support resolution of 8-bit (or less) to 12-bit (or more). The IC 100 can support programmable sample rate from 468.7 KSPS (or less) to 60 MSPS (or more). The IC 100 can include a low speed (such as, SPI) and high speed (such as, LVDS) communication interface for real time data collection, monitoring, and modulation. The IC 100 can support rapid turning on/off of the gate or drain of a semiconductor device connected to the IC 100. The IC 100 can, in some cases, include internal or external temperature sensing and digitization.

Receiver and Transmitter

Figure 2:
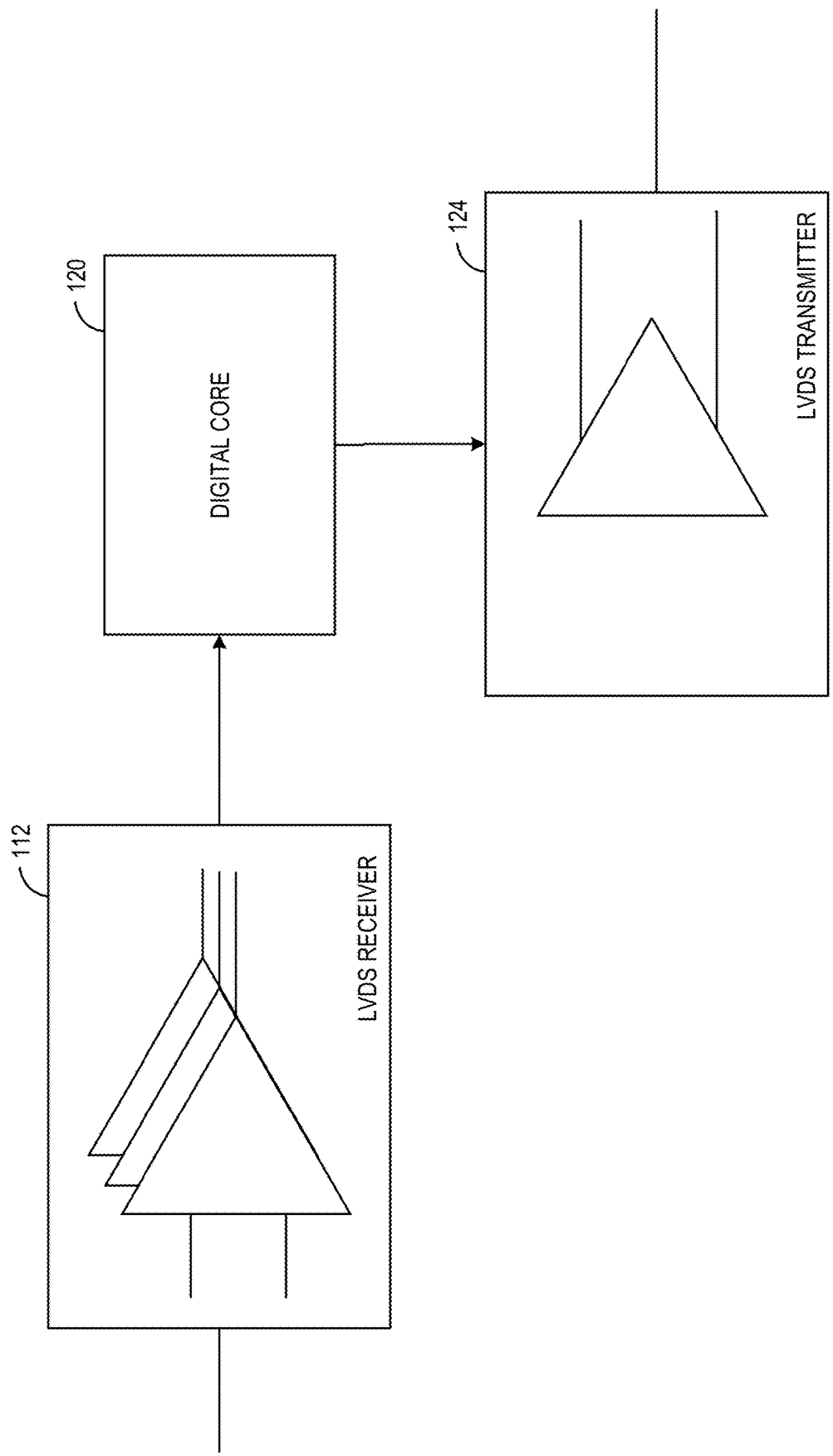
FIG. 2 illustrates high speed communication interfaces of the IC of FIG. 1.

FIG. 2 illustrates the receiver 112 and transmitter 124 of the IC 100. The receiver 112 and transmitter 124 can be configured to provide communication with off-chip systems or components, such as field programmable gate arrays (FPGAs). The transmitter 124 can be responsible for transmitting data (including information, control signals, etc.), and the receiver 112 can be responsible for receiving data. In some cases, the receiver 112 and transmitter 124 can utilize low-voltage differential signaling (LVDS). LVDS is a current-based protocol that can facilitate real-time control of the IC 100. For instance, the IC 100 can interface with an external FPGA to communicate measurements and receive control signals to adjust the gate voltage. Communication using the receiver 112 and transmitter 124 can be faster than over the communication interface 118 (for example, LVDS is a higher speed protocol than SPI).

Charge Pump and Low Dropout Regulator

Figure 3:
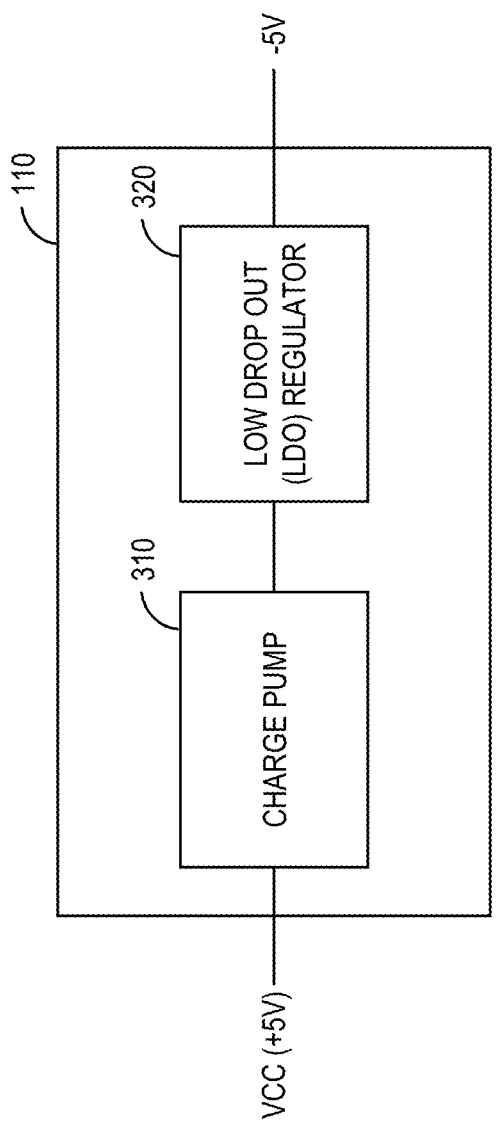
FIG. 3 illustrates a supply and reference generation, including a charge pump and low drop out regulator, of the IC of FIG. 1.

With reference to FIG. 3, the reference voltage generation circuit 110 can include a charge pump 310. In some cases, the charge pump 310 can convert internal 5V supply to −6V for a low dropout (LDO) regulator 320 to regulate voltages up to −6V for driving one or more semiconductor devices (such as, GaN devices). The charge pump 310 can be configured to regulate for any voltage range required to operate semiconductor devices comprising other materials (such as, SiC, GaAs, $Al_2N_3$/AlN, Si, Ge, InP, GaP, BN, etc.)

The regulator 320 can perform input voltage regulation provided by the charge pump 310. For example, regulated output can provide −6V supply voltage to the gate driver circuit 126, which can advantageously produce a signal having low level of ripple to drive the gate of one or more GaN devices.

Gate Driver

Figure 4:
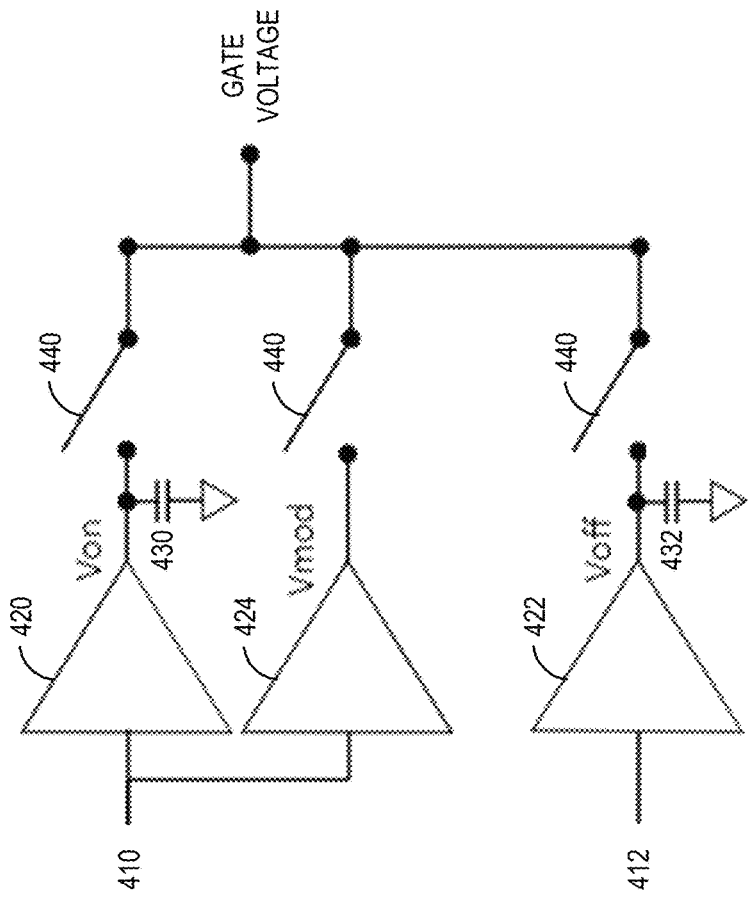
FIG. 4 illustrates a gate driver of the IC of FIG. 1.

With reference to FIG. 4, the IC 100 can include the gate driver circuit 126 configured to control the voltage provided to the gate of a semiconductor device being controlled by the IC 100. The gate driver circuit 126 can control the semiconductor device by varying the gate voltage between the on-voltage and off-voltage. As described herein, the IC 100 can determine the on-voltage 410 and the off-voltage 412 of a semiconductor device during initialization (or in the initialization stage). The on-voltage 410 and off-voltage 412 can be stored in memory, such as a memory of the digital core 120. On-voltage 410 and off-voltage 412 can be generated by a pair of digital to analog converters (DACs). Capacitors 430 and 432 connected, respectively, to buffers 420 and 422 (which can be unity gain amplifiers) can be pre-charged to the on-voltage 410 and the off-voltage 412, respectively. By controlling the switches 440 in the output path (for instance, with the digital core 120), the gate voltage can be rapidly changed to turn on/off the semiconductor device. In some cases, the switches 440 can switch at rates between a few kHz (or less or more) to a few hundred MHz (or less or more). The pre-charged capacitors function like a battery and provide energy required to turn on/off the semiconductor device driven by the driver circuit 126 in a relatively short time. The capacitor 430 can be charged when the device is turned off and the corresponding switch 440 is open, while the capacitor 432 can be charged when the device is turned on and the corresponding switch 440 is open.

The on-voltage 410 can be changed (or modulated) by closing the switch 440 at the output of a modulation buffer 424 (which can be a unity gain amplifier). The modulation voltage can be user defined. Modulation can be used to switch the operating mode of the semiconductor device, for instance, from saturation to linear or vice versa. Modulation is also advantageous to select a gate bias voltage that optimizes one or more figures of merit of the semiconductor device in the linear region.

Capacitors 430 and 432 can be positioned external to the IC 100 (also referred to as off-chip). The buffers 420 and 422 can be sized to recharge the capacitors 430 and 432, respectively. The buffers 420 and 422 can be sized to provide a current source and sink (such as, direct current (DC) source and sink) for different semiconductor devices. That is, the buffers 420 and 422 can be selected to have suitable drive strengths. In some instances, the buffer 424 can be similarly selected.

Drain Sensing Circuit

Figure 5:
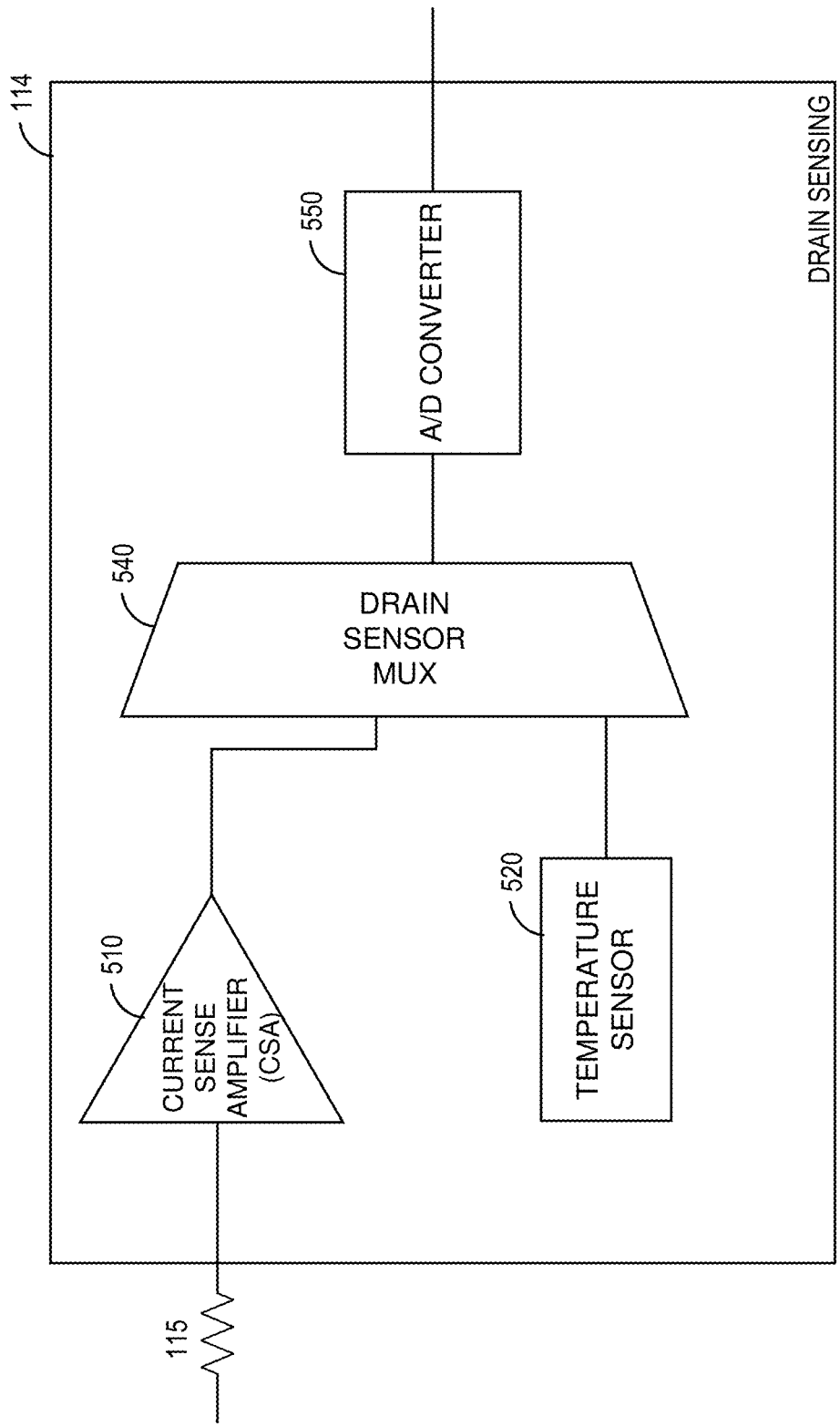
FIG. 5 illustrates drain sensing of the IC of FIG. 1.

Without any loss of generality, the IC 100 is configured to sense the current through the drain terminal of the semiconductor device it is connected to and adjust the bias voltage at the gate terminal of the semiconductor device to allow a threshold amount of current to flow through the drain terminal. The threshold amount of drain current can correspond to an amount of drain current that increases/decreases/optimizes one or more figures of merit of the semiconductor device. For example, the threshold amount of drain current can correspond to an amount of drain current that maximizes a gain provided by the semiconductor device. As another example, the threshold amount of drain current can correspond to an amount of drain current that increase power efficiency and decreases non-linearity (such as, intermodulation distortion) of the semiconductor device. In addition to the drain current, it may be also advantageous to sense the voltage at the drain terminal as well as the temperature of the semiconductor device FIG. 5 shows an implementation of a sensing circuit 114 that is configured to sense the current at the drain terminal of the semiconductor device and/or temperature of the semiconductor device. The drain sensing circuit 114 comprises a current sense resistor 115 external to the IC 100. The drain current of the semiconductor device is configured to flow through the resistor 115. The drain current flowing through the resistor 115 can be large, such as, for example between approximately a few 10 s of milliamperes to many hundreds of amperes. For example, the sensed current can vary between 26 mA and about 56 A in some implementations. The current sense amplifier 510 is configured to monitor the voltage at the output of the resistor 115 (which can be large) and convert the high voltage to a voltage level compatible with the voltage circuitry inherent to the IC 100 before being digitized by an analog to digital converter (ADC) 550. This allows an IC fabricated with a low voltage semiconductor fabrication process (such as, a 5V or under semiconductor fabrication process) to sense high dynamic range current for high common mode voltage (such as, from a few millivolts to a few kilovolts). In some implementations, the input common mode voltage range can be up to 180V. The advantage of using an IC fabricated with a low voltage semiconductor fabrication process is cost, speed and level of integration. High voltage processes can be lower speed and thus may not be amenable to high level of integration with other digital systems.

The current sense amplifier 510 can be implemented as a differential amplifier with feedback (also referred to as a closed loop architecture) or without feedback (also referred to as an open loop architecture). In such implementations, the current sense amplifier 510 is configured to monitor the voltage across the current sense resistor 115, converts the voltage across the resistor 115 from a high common mode level differential signal to a low common mode level signal that is compatible with the low voltage circuitry inherent to the IC 100, and amplifies the low common level signal prior to being digitized by the ADC 550. Without any loss of generality, the current sense amplifier 510 is configured to level shift the common mode voltage input across the resistor 115 that is input to the IC 100 to common mode voltage levels that are compatible with the voltages of the IC 100. The architecture of the current sense amplifier 510 is also configured to reduce flicker noise of the transistors in the current sense amplifier 510 as well as reduce the impact of resistor mismatch in the input common mode control circuit. These features are described in further detail with respect to FIG. 6.

Referring to FIG. 5, the drain sensing circuit 114 can also be configured to receive measurements from other sensors such as temperature sensor 520 and/or drain voltage sensor. The measurements from the current sense amplifier 510 and other sensors can be digitized independently or multiplexed using a multiplexer 540 as shown in FIG. 5.

In some implementations, the current sense amplifier 510 is configured to convert the voltage across the external current sense resistor into a current flowing through resistors internal to the IC 100 and back to a voltage that can be handled by the IC 100. Accordingly, the current sense amplifier 510 can be considered as a transimpedance amplifier with high common mode rejection with the ability to withstand large common mode voltage. By choosing appropriate values of the current sense resistors 115 and/or the resistors internal to the IC 100, the current sense amplifier 510 can be configured to withstand common mode voltage up to a few 100 s of volts or a few megavolts.

Figure 6:
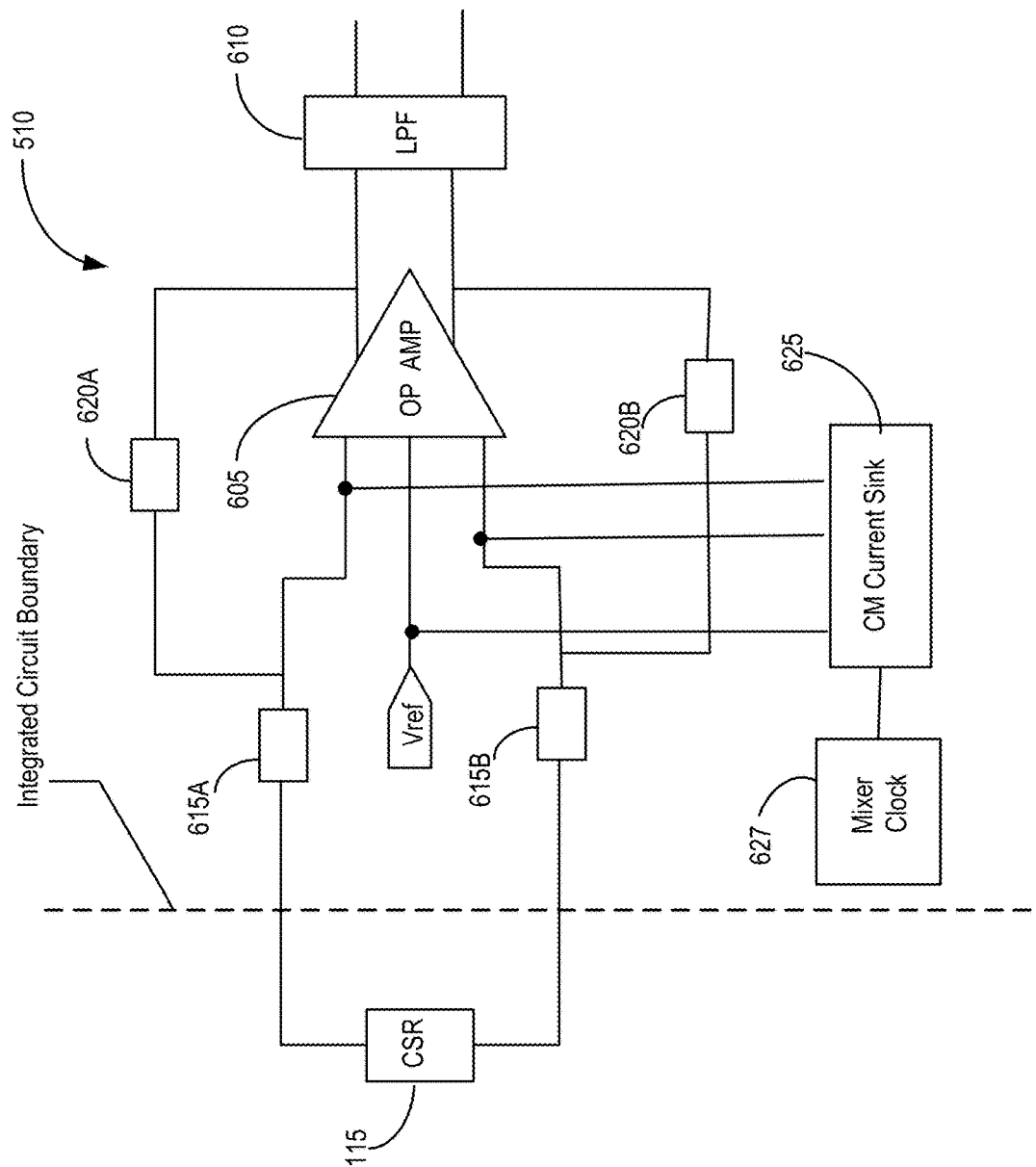
FIG. 6 illustrates an implementation of a current sense amplifier of the IC of FIG. 1.

FIG. 6 shows an implementation of the current sense amplifier 510 with input common mode control used as active elements. The illustrated implementation employs precision resistors 615A and 615B to connect the terminals of the current sense resistor 115 to the input nodes of an operational amplifier 605. Precision resistors 620A and 620B connect the output nodes of the operational amplifier 605 to the input nodes of the operational amplifier 605. The current sense amplifier comprises a common mode current sink block 625 that provides input common mode control in addition to serving as a sink for the common mode currents. To increase the signal to noise ratio and improve the dynamic range of the current sense amplifier 510, the common mode current sink block 625 up converts the low frequency noise (such as, flicker noise) which is rejected by a low pass filter 610 before further processing of the sensed current. The up conversion of the low frequency noise is performed by mixing the noise with a mixer clock generated by a clock source 627. This approach can remove the flicker noise from the transistors used in the current sense amplifier 510. Up conversion can include increasing the frequency.

As discussed above, the illustrated implementation is configured to monitor high common mode voltage levels across the current sense resistor 115, convert it to common mode voltage levels that are compatible with the voltage levels of the IC 100. Another feature of the implementation of the current sense amplifier 510 illustrated in FIG. 6 is that it can process the sensed current without dividing down the voltage across the current sense resistor 115 which advantageously increases the precision of the current sense amplifier.

Analog-to-Digital Converter

The IC 100 can utilize one or more analog-to-digital converters (ADCs). Any of the ADCs disclosed herein can have 12-bit resolution. For example, and with reference to FIGS. 5 and 7, the ADC 550 can digitize the current sense amplifier output (or another analog signal output by the multiplexer 540) with 12-bit resolution. Although 12-bit ADCs are described in some implementations, any of the ADC described herein can have a higher or lower different resolution, such as between 8 bits (or less) to 16 bits (or more).

Figure 7:
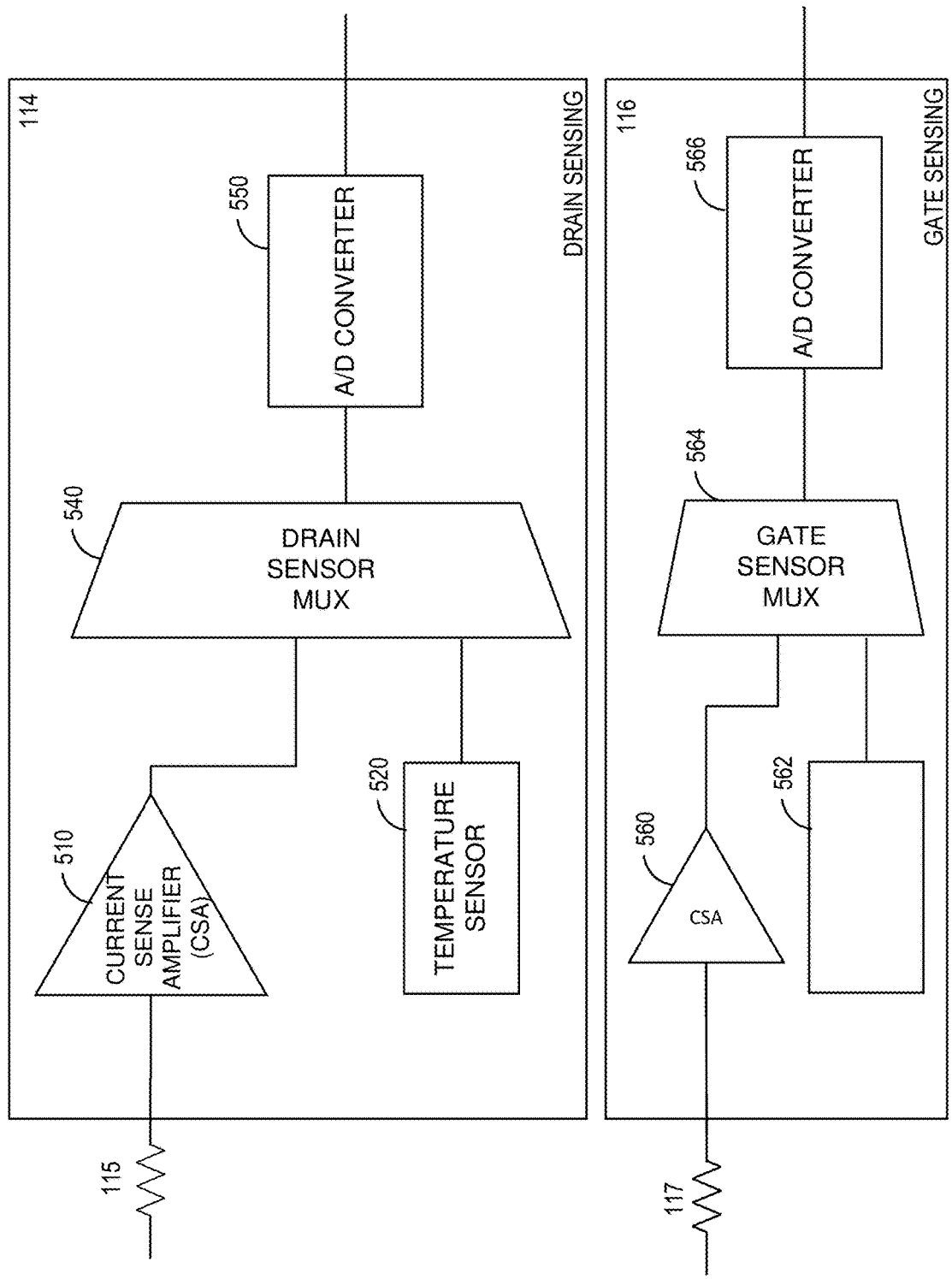
FIG. 7 illustrates drain sensing and gate sensing of the IC of FIG. 1.

Similarly to FIG. 5, FIG. 7 illustrates the drain sensing circuit 114. FIG. 7 also illustrates the gate sensing circuit 116 that can include a current sense amplifier 560 for sensing gate current (which can be similar to the current sense amplifier 510), a gate voltage sensor 562, and an optional multiplexer 564 (which can be similar to the multiplexer 540). In some instances, there can be inputs to the multiplexer 564 (such as, signal(s) being output by the gate driver circuit 126). In some implementations, measurements from a temperature sensor can also be input to the gate sensing circuit 116. The gate sensing circuit 116 can include an ADC 566, which can digitize the various sensed measurements.

It may be advantageous for some implementations of current sense amplifier (CSA) to handle switching events (such as, successive approximation register (SAR) switching events) and settle to a value with a desired accuracy within a few nanoseconds (or less of more). Offset, gain error and non-linearity can be calibrated. Both foreground and background calibration techniques are contemplated herein. In some implementations, background calibration may be implemented if problems due to temperature drifts arise.

The implementations of ADCs disclosed herein (such as, the ADC 550 or 650) are configured for high precision measurement and digitization of analog signals, such as the current output from the current sense amplifier 510. Some implementations of the ADC can be configured as a 12-bit 60 MSPS successive approximation register (SAR) ADC. The implementations of the ADC can be configured to have low delay. The implementations of the ADC can be configured to take in a sample and lock the latch state until the sampling is complete before accepting another sample. In some cases, the ADC can be configured as binary metal-insulator-metal capacitor ADC (also referred to as CDAC) with 2-bit redundance. Digital error correction and post conversion can be included in some implementations.

Figure 8:
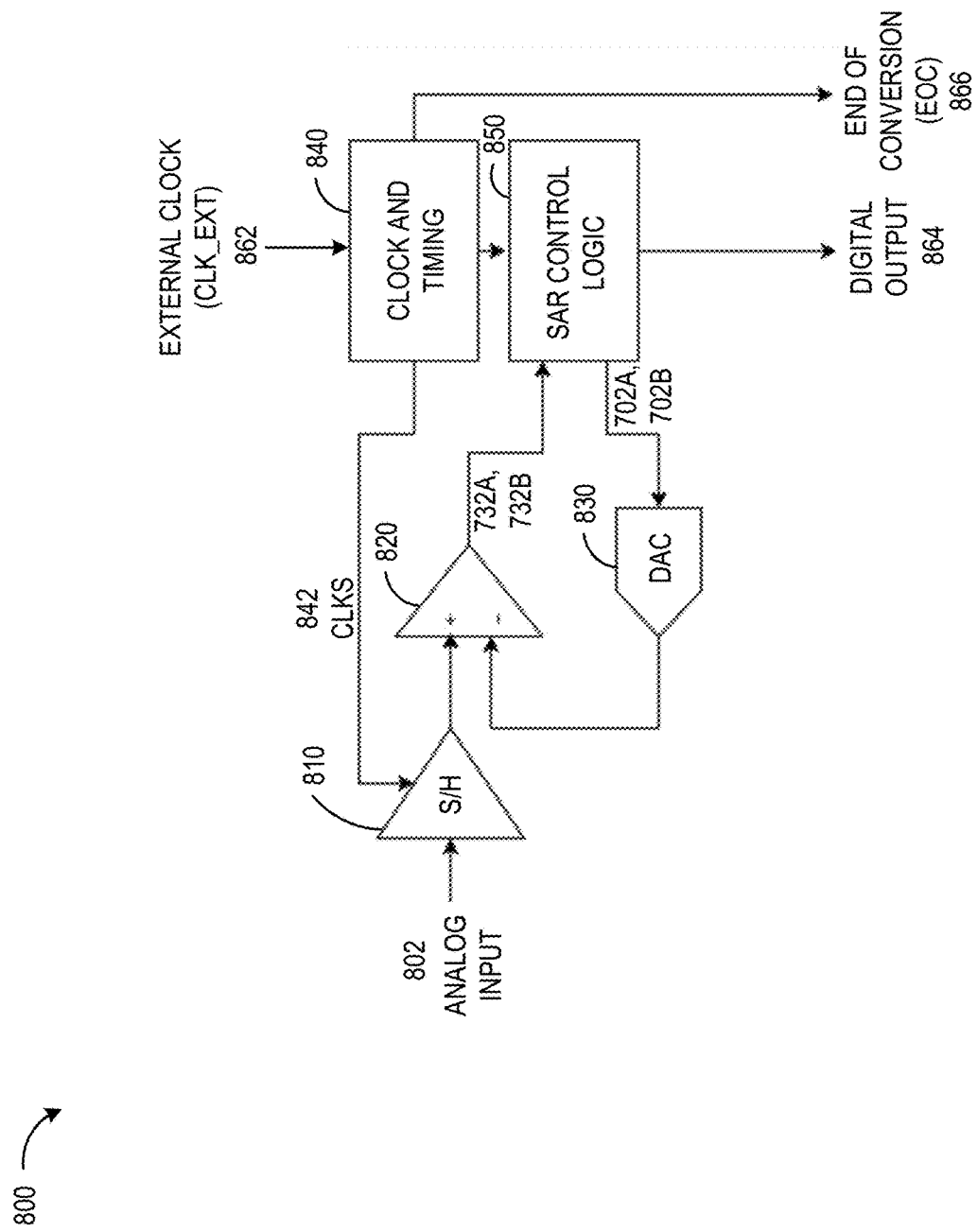
FIG. 8 illustrates an analog to digital converter of the IC of FIG. 1.

FIG. 8 illustrates a successive approximation register (SAR) ADC 800. Analog input signal 802 being digitized can be buffered in a sample and hold buffer 810. The ADC 800 can implement a binary search process to digitize the analog input signal 802. To implement the binary search process, an N-bit register in a SAR control logic 850 can be set to a value in which most significant bit (MSB) is "1" and the rest of the bits are "0" (for instance, 1000 0000 0000 in case of a 12-bit ADC). As a result, a DAC 830 would output midscale voltage (such as, $V_{REF}/2$, where $V_{REF}$ is the reference voltage provided to the ADC 800). Comparator 820 performs a comparison between output of the DAC 830 and the analog input signal 802 stored in the sample and hold buffer 810. If the analog input signal 802 is greater than output of the DAC 830, the output of comparator 820 would be logic high and the MSB of the register remain at "1." Otherwise, the output of the comparator 820 would be logic low, and the MSB of the register is cleared to "0."

The SAR control logic 850 then moves to the next bit in the register (that is, the bit that follows the MSB) and similar operations are performed. For such bit, the DAC 830 would be set to output either three-quarters scale or quarter scale voltage depending on the value of the MSB. This sequence continues until the least significant bit (LSB) is processed. Subsequently, conversion of the analog input signal 802 to a digital value has been completed, and N-bit digital output signal 864 becomes available. End of conversion (EOC) 866 is produced by a clock and timing block 840 to signify that the conversion has been completed. Next, another analog input signal 802 can be digitized by the ADC 800.

The clock and timing block 840 provides timing for the above-described process of converting the analog input signal 802 to the digital output signal 864. The clock and timing block 840 can receive as input external clock 862 (for instance, from the clock generator 122 or the digital core 120) to synchronize the ADC 800 with other components of the IC 100. The clock and timing block 840 can generate one or more timing signals for controlling the operation of the ADC 800. For example, the clock and timing block 840 can generate a sample (or sampling) clock 842 (CLKS) to control the sample and hold buffer 810 to either continue buffering the current analog input signal 802 value or to sample and buffer another analog input signal value.

Advantageously, SAR ADCs have low power consumption and small form factor. In some cases, SAR ADCs can provide sampling rates between 10 MSPS and 60 MSPS. In order to increase the sampling rate of the ADC (such as, the ADC 800), one or more of the approaches described below can be used.

Figure 9A:
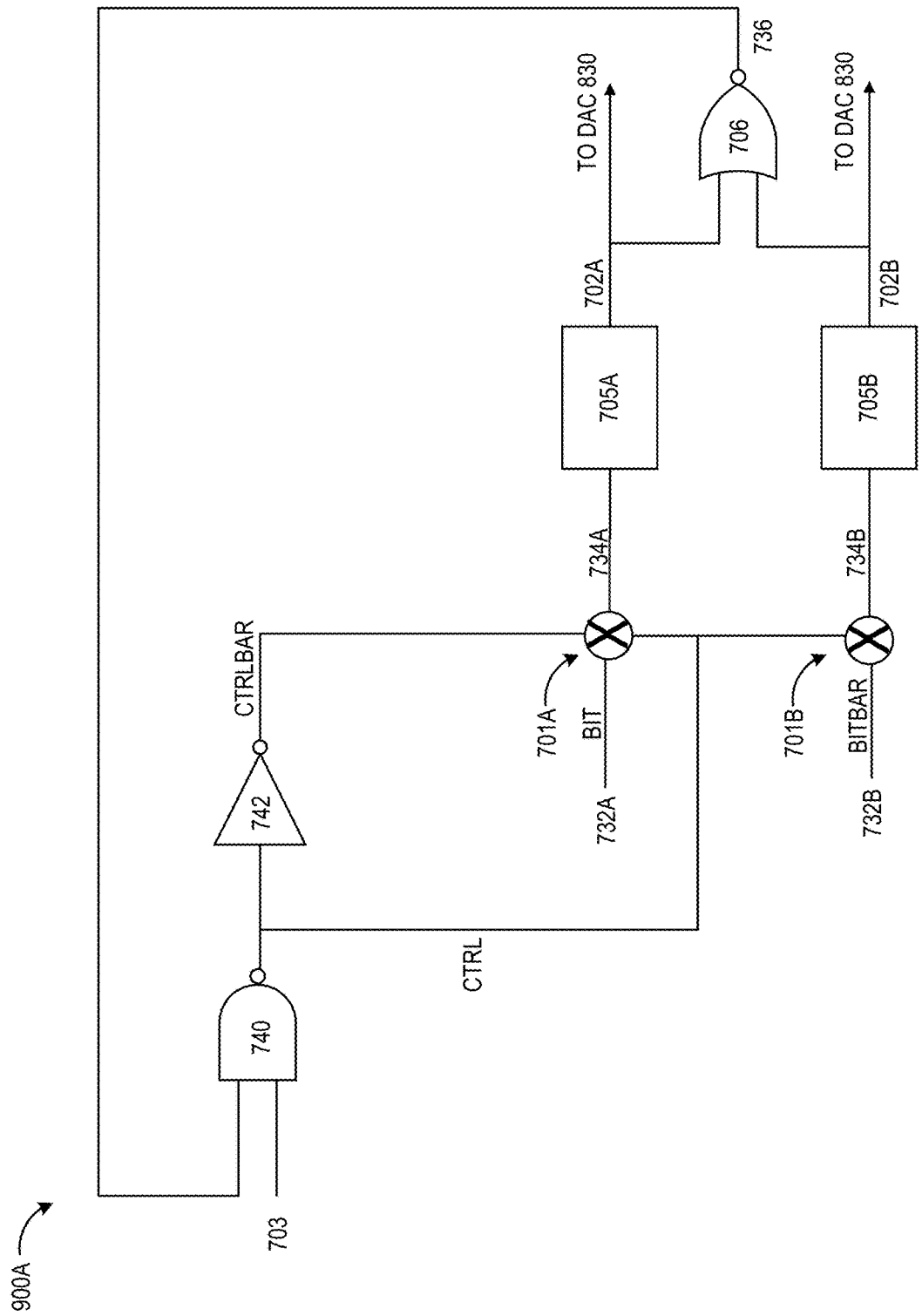
FIGS. 9A-9B illustrate self-locking latch circuit of an analog to digital converter, such as that of FIG. 8.

With reference to FIG. 9A, any of the ADCs of the IC 100 (such as, the ADC 800) can utilize a circuit of a low delay self-locking latch 900A (sometimes referred to as low delay self-locking latched driver cell). The latch 900A can be utilized by a controller (such as, the SAR control logic 850) to process outputs from the comparator 820. For instance, the latch 900A can be part of the N-bit register described above. The latch 900A can be a one-bit storage, and N-latches 900A can be used to make up the N-bit register described above.

The comparator 820 can provide a differential output that includes complementary signals BIT 732A and BITBAR 732B. These signals can be input into switches 701A and 701B (which can be CMOS switches, such as tri-state switches), respectively. In some cases, BIT 732A and BITBAR 732B can be logical signals generated elsewhere in the IC 100. BIT 732A and BITBAR 732B can be changing at high rate, such as about 1 GHz clock rate. The high clock rate requirement of the one or more ADCs of the IC 100 can mandate that the processing delay of the SAR ADC be as small as possible. As explained below, unlike certain implementations of SAR ADCs that use logical gates for processing, the latch 900A can use switches 701A and 701B in series with latches 705A and 705B to reduce the delay in processing the data.

Figure 9B:
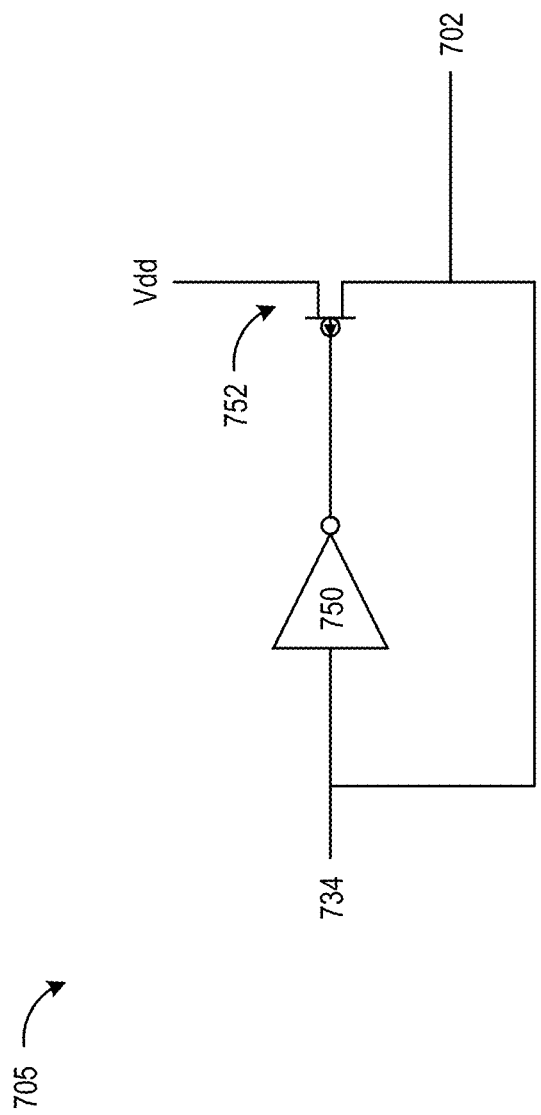

The switches 701A and 701B can be controlled by a control signal CTRL to transition between two states: 1) closed state in which the inputs 732A and 732B are passed through and 2) open state in which the inputs 732A and 732B are not passed through. When the inputs 732A and 732B are passed through (as values 734A and 734B, respectively), they are stored in latches 705A and 705B, respectively. With reference to FIG. 9B, each of the latches 705A and 705B (illustrated generally as 705) can include an inverter 750 with a PMOS switch 752 (illustrated as a PMOS transistor). In such configuration, the value of the input 734 (which can be "0" (logic low) or "1" (logic high)) is stored in the latch 705. This can be accomplished by feedback from a drain terminal of the PMOS switch 752 (whose source terminal is connected to positive voltage, Vdd) to input of the inverter 750. For instance, suppose that the input 734 is "0." The output of the inverter would be "1," causing the PMOS switch 752 to be off, and the output 702 to be "0." As another example, suppose that the input 734 is "1." The output of the inverter would be "0," causing the PMOS switch 752 to be on, and the output 702 to be "1."

Outputs 702A and 702B of the latches 705A and 705B, respectively, are provided to the DAC 830 to set the next voltage input for the comparator 820. In operation, the ADC (such as, via the SAR control logic 850) can be looking at the high-speed input and trying to decide what to do with signals 702A and 702B. A clock signal, which can be provided by the clock and timing block 840, can control generation of the inputs BIT 732A and BITBAR 732B. The clock signal can define the timing for the binary search process controlled by the SAR control logic 850. As explained above, part of the binary search process can include switching one of the outputs 702A and 702B to high ("1") to drive the DAC 830.

The latch 900A can operate as follows. The outputs 702A and 702B can remain low ("0") until one of the inputs BIT 732A or BITBAR 732B goes high. Initially, 702A and 702B are both low and the output 736 of a NOR gate 706 is high. The output 736 is input into a NAND gate 740. Assume that an enable signal 703 is high. As a result, the output of the NAND gate 740 is low, and the control signal CTRL is low. This can cause the switches 701A and 701B to close so that the inputs BIT 732A and BITBAR 732B are passed through and latched in the latches 705A and 705B. The switches 701A and 701B can be controlled by complementary control signals CTRL (switch 701B can be controlled by the CTRL signal and switch 701A can be controlled by an inverted signal CTRLBAR output by an inverter 742, or vice versa). The NOR gate 706 can monitor the outputs 702A and 702B of the latches 705A and 705B, respectively, and these output signals can drive the DAC 830. Since one of the outputs 702A or 702B is high and the other is low (due to the complementary nature of BIT 732A and BITBAR 732B signals), the output 736 of the NOR gate 706 would be low, which can set the control signal CTRL to high and open the switches 701A and 701B. In this state, the latch 900A has latched the inputs BIT 732A and BITBAR 732B and is not looking for inputs. As described above, the latches 705A and 705B store the inputs BIT 732A and BITBAR 732B, respectively.

Once the inputs BIT 732A and BITBAR 732B have been processed, a controller of the ADC (such as, the SAR control logic 850) can reset the main SAR comparator without affecting the latch 900A. The enable signal 703 can act as an overall enabler of the latch 900A. The enable signal 703 can be generated by a controller, such as the SAR control logic 850. When the enable signal 703 is high, the state of the switches 701A and 701B is determined by the output of the NOR gate 706. When the enable signal 703 is low, the switches 701A and 701B are open (and, as a result, the latch 900A is and maybe reset to a predetermined state).

Advantageously, the latch 900A can function as a reduced delay switch driver for high-speed applications. The low delay self-locking latched driver can be thought of as having a gate (switches 701A and 701B) that opens and closes in series with a latch (latches 705A and 702B) that figures out when to open and close the gate. The latch 900A can function as a 1-bit memory and provides the least possible amount of delay. The latch 900A can be self-locking in that it latches input data when needed. High dynamic range requirement (such as, from a few milliamperes to a few hundred amperes) of the analog input being digitized (such as, the signal provided by a current sense amplifier) and high clock rate of the ADC can motivate the need for a low delay latch 900A. Unlike complex logic circuits with many logic gates that add significant delay, the latch 900A is self-locking and operates with a low delay.

Figure 9C:
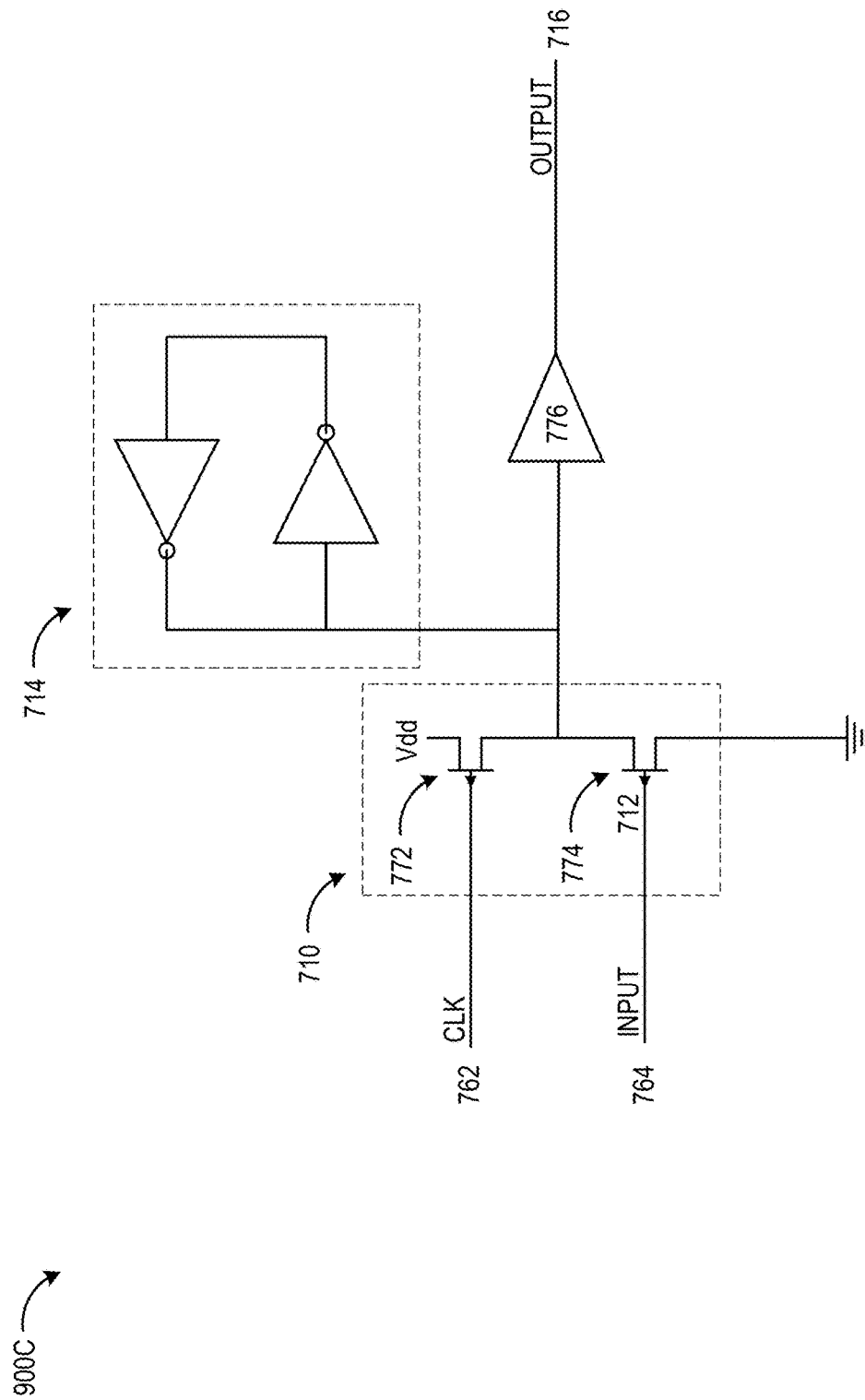
FIG. 9C illustrates a flip-flop of an analog to digital converter, such as that of FIG. 8.

FIG. 9C illustrates a circuit of a master-slave flip-flop 900C implemented with tri-state switches and inverters. The flip-flop 900C can be utilized by the ADC (such as, the ADC 800). For instance, the SAR control logic 850 can utilize one or more flip-flops 900C to store data used during digitization of the analog input, to produce the sample clock (such as, the sample clock 842), or the like. Unlike flip-flop designs that utilize many logic gates, the flip-flop 900C can operate with a low delay.

The flip-flop 900C can include block 710 with transistors 772 and 774 (which can be NMOS transistors). As illustrated in FIG. 9C, a clock signal 762 can be provided to the transistor 772 and input signal 764 (D) can be provided to the transistor 774. The flip-flop 900C can be configured to output a logic high ("1") when the clock signal 762 is high (or present), which can be caused by the transistor 772 turning on and outputting a positive voltage (such as, Vdd) associated with a logic high level. When the clock signal 762 is low, the flip-flop 900C can be configured to remain in the same state and output data previously latched in a buffer 714 that includes two inverters connected in a back-to-back configuration. A buffer 776 can be present to separate the circuitry of the flip-flop 900C from the output 716.

When the clock signal 762 is low and the input 764 is high ("1"), node 712 (associated with a gate of the transistor 774) in block 710 can be pre-charged to a high voltage (such as, Vdd). As a result of pre-charging, current starts to flow through drains of the transistors 772 and 774 as soon as the transistor 772 has been turned on. That is, pre-charging reduces or eliminates any delay due to switching of one or more transistors. The output of block 710 can be a logic low even though the node 712 is maintained at a high voltage. As soon as the clock signal 762 transitions to a logic high, the transistor 772 turn on and block 710 outputs a logic high (due to the flow of current through the drains of the transistors 772 and 774), which is latched by the buffer 714. When the clock signal transitions to a logic low, the output 716 is maintained. As a result, a logic high value ("1") of the input 764 is latched by the flip-flop 900C. When the input 764 is a logic low value ("0"), the flip-flop 900C can similarly latch the input value.

As a result of pre-charging and use of few components, the flip-flop 900C can operate with a low delay. The flip-flop 900C can be reset by a reset signal controlling the gate of the transistor 774.

Figure 9D:
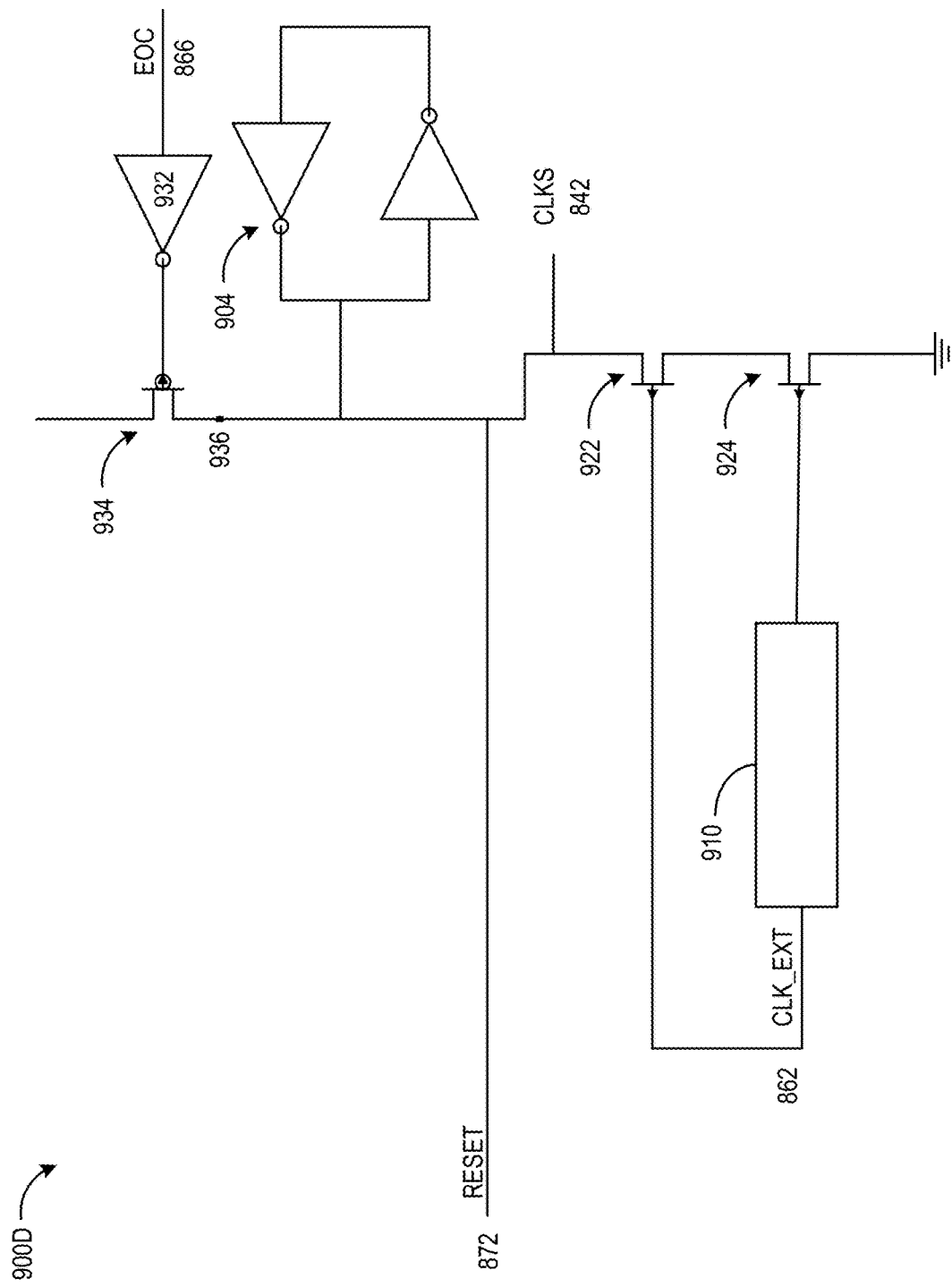
FIG. 9D illustrates a sample clock generator of an analog to digital converter, such as that of FIG. 8.

FIG. 9D illustrates a sample clock generator 900D to control sampling of the analog input signal 802 by the sample and hold buffer 810. The sample clock generator 900D can include an edge detector circuit configured to detect rising and falling edges of input signals: end of conversion (EOC) 866 and external clock (CLK_EXT) 862. The sample clock generator 900D can output the sample clock signal (CLKS) 842. the clock generator 900D can produce the sample clock signal 842 that transitions to: 1) a logic low state as a result of detecting a falling edge of the CLK_EXT 862 and 2) a logic high state as a result of detecting a rising edge of the EOC 866. When the sample clock signal 842 is high, the analog input signal 802 can be sampled by the sample and hold buffer 810. When the sample clock signal 842 is low, a buffered analog input signal 802 value can be being digitized by the ADC. That is, the clock generator 900D can operate as a set/reset latch in that EOC 866 sets the output of the clock generator and CLK_EXT 862 resets the output.

With reference to FIG. 9D, suppose that EOC 866 transitions to a high state. Transistor 924 can be pre-charged to a logic high by a pre-charge circuit 910. In some cases, the transistor 924 can be pre-charged when CLK_EXT is high. Circuit 910 can operate similarly to the pre-charging described above in connection with FIG. 9C. As a result of EOC 866 transition to the high state, transistor 934 (illustrated as a PMOS transistor) would turn on due to the output of an inverter 932 being low, and node 936 would be at high voltage (such as, Vdd) causing the output CLKS 842 to transition to a logic high. This transition of CLKS 842 can be caused by turning on the transistor 934 and turning on the transistor 924 (as well as the transistor 922) to provide a return path for the current. State of the rising edge of EOC 866 (as well as CLKS 842) can be latched in a buffer 904 formed by two inverters connected in a back-to-back configuration.

When CLK_EXT 862 transition to a low state, CLKS 842 can also transition to the low state. This can be caused by turning off the transistor 924 (as well as the transistor 922). As a result, CLKS 842 generated by the clock generator 900D can 1) transition to a logic high as a result of a rising edge of EOC 866 and 2) transitions to a logic low as a result of a falling edge of CLK_EXT 862. This is illustrated in FIG. 9E.

The clock generator 900D can incorporate low-delay edge detection circuitry. In some cases, EOC 866 can be a very short pule (such as, a few nanoseconds). The clock generator 900D can be configured to detect the rising edge of the EOC 866 and hold its state.

Resetting the clock generator 900D can be performed with RESET 872, which can be a logic low or a logic high signal.

In some cases, one or more of buffers illustrated in the figures can be omitted. For instance, one or more inverter pairs 904 or 714 may be replaced with a non-inverting buffer or omitted altogether.

ADDITIONAL EXAMPLES

Example 1: An integrated circuit (IC) for driving one or more semiconductor devices comprising:
 at least one current sense amplifier configured to:
  receive an input signal corresponding to a current flowing through a semiconductor device, the input signal associated with a first signal range that exceeds a signal range of a low voltage semiconductor integrated circuit; and
  convert the input signal to a voltage signal associated with a second signal range, the second signal range being compatible with the signal range of the low voltage semiconductor integrated circuit; and
 a control circuitry configured to process the voltage signal and output a control signal for driving the semiconductor device,
 wherein the IC is a low voltage semiconductor integrated circuit.

Example 2: The IC of Example 1, wherein the at least one current sense amplifier and the control circuitry are housed in a single integrated circuit package.

Example 3: The IC of Example 2, wherein the at least one current sense amplifier is configured to be connected to a resistor positioned outside the integrated circuit package, the resistor configured to be connected to a terminal of the semiconductor device to facilitate the current to flow across the resistor.

Example 4: The IC of any of the preceding Examples, wherein the at least one current sense amplifier comprises at least one transistor, a frequency converter, and a low pass filter, and wherein the frequency converter is configured to up convert a noise produced by the at least one transistor and the low pass filter is configured to filter out up converted noise so that the noise is removed from the voltage signal output by the at least one current sense amplifier.

Example 5: The IC of Example 4, wherein the frequency converter comprises a clock source and a mixer, the mixer configured to utilize a clock signal generated by the clock source to up convert the noise produced by the at least one transistor.

Example 6: The IC of any of Examples 4 or 5, wherein noise produced by the at least one transistor comprises low frequency noise.

Example 7: The IC of Examples 4 or 5, wherein noise produced by the at least one transistor comprises flicker noise.

Example 8: The IC of any of the preceding Examples, wherein the semiconductor device comprises a transistor and the input signal corresponds to a current through a drain or gate of the transistor.

Example 9: The IC of Example 8, wherein the control signal is provided to the gate of the transistor to control an operating mode of the transistor.

Example 10: The IC of any of the preceding Examples, wherein the semiconductor device comprises a radio frequency (RF) amplifier.

Example 11: The IC of Example 10, wherein the RF amplifier comprises a Gallium Nitride (GaN) amplifier.

Example 12: An integrated circuit (IC) for driving one or more semiconductor devices comprising:
 an analog front end configured to process an analog input signal received from a semiconductor device;
 an analog to digital converter (ADC) configured to receive the analog input signal from the analog front end and convert the analog input signal to a digital signal, the ADC comprising a latch configured to store data used during conversion of the analog input signal to the digital signal, the latch comprising:
  first and second switches connected to first and second buffers configured to receive first and second values passed through the first and second switches responsive to the first and second switches being in a closed state, the first and second buffers further configured to retain the first and second values responsive to the first and second switches being in an open state,
  at least one of first or second outputs of the first or second buffers being configured to control a transition of the first and second switches from the closed state to the open state; and
 a digital control circuitry configured to process the digital signal and output a control signal for driving the semiconductor device.

Example 13: The IC of Example 12, wherein at least one of the first or second buffers comprises an inverter and a transistor, the inverter connected to a gate of the transistor and output of the transistor connected to an input of the inverter.

Example 14: The IC of Example 13, wherein the transistor comprises a p-type transistor.

Example 15: The IC of any of Examples 12 to 14, wherein the ADC comprises a successive approximation register (SAR) configured to convert at a rate exceeding 10 mega samples per second (MSPS).

Example 16: The IC of Example 15, wherein:
the SAR comprises a comparator and a digital to analog converter (DAC);
the first and second values are output by the comparator and stored in the latch; and
the latch is configured to provide the first and second values to set the DAC.

Example 17: The IC of Example 16, wherein the first and second values are complementary.

Example 18: The IC of Example 17, wherein the latch comprises a NOR gate connected to the output of the first and second buffers, and wherein the output of the NOR gate is configured to control the transition of the first and second switches from the closed state to the open state.

Example 19: The IC of Example 18, wherein responsive to storing the first and second values in the first and second buffers, the output of the NOR gate switches to a logic low causing the first and second switches to transition from the open state to the closed state.

Example 20: The IC of any of Examples 12 to 19, wherein the semiconductor device comprises a transistor and the analog input signal corresponds to a current through a drain or gate of the transistor.

Example 21: The IC of Example 20, wherein the control signal is provided to the gate of the transistor to control an operating mode of the transistor.

Example 22: The IC of any of Examples 12 to 21, wherein the semiconductor device comprises a radio frequency (RF) amplifier.

Example 23: The IC of Example 22, wherein the RF amplifier comprises a Gallium Nitride (GaN) amplifier.

Example 24: An integrated circuit (IC) for driving one or more semiconductor devices comprising:
an analog front end configured to process an analog input signal received from a semiconductor device;
an analog to digital converter (ADC) configured to receive the analog input signal from the analog front end and convert the analog input signal to a digital signal, the ADC comprising a flip-flop configured to store data used during conversion of the analog input signal to the digital signal, the flip-flop comprising:
a first transistor controlled by a clock signal,
a second transistor connected to the first transistor and controlled by an input signal, a gate of the second transistor configured to be pre-charged when the clock signal is low to reduce a delay in turning on the second transistor and storing the input signal, and
a buffer connected to an output of the second transistor, the buffer configured to store the input signal; and
a digital control circuitry configured to process the digital signal and output a control signal for driving the semiconductor device.

Example 25: The IC of Example 24, wherein the gate of the second transistor is further configured to be pre-charged when the input signal is high.

Example 26: The IC of any of Examples 25 or 25, the flip-flop is configured to store the input signal responsive to the clock signal transitioning from low to high.

Example 27: The IC of any of Examples 25 or 26, wherein the first and second transistors comprise N-type metal-oxide-semiconductor (NMOS) transistors.

Example 28: An integrated circuit (IC) for driving one or more semiconductor devices comprising:
an analog front end configured to process an analog input signal received from a semiconductor device;
an analog to digital converter (ADC) configured to receive the analog input signal from the analog front end and convert the analog input signal to a digital signal, the ADC comprising a clock generator configured to produce an internal clock signal used during conversion of the analog input signal to the digital signal, the clock generator comprising:
a first transistor controlled by a signal produced by the ADC, and
a second transistor connected to the first transistor and controlled by an external clock signal, a gate of the second transistor configured to be pre-charged when the signal produced by the ADC is low to reduce a delay in turning on the second transistor and producing the internal clock signal,
wherein the internal clock signal is configured to transition high responsive to detection of a rising edge of the signal produced by the ADC and transition low responsive to detection of a falling edge of the external clock signal; and
a digital control circuitry configured to process the digital signal and output a control signal for driving the semiconductor device.

Example 29: The IC of Example 28, wherein the ADC comprises a successive approximation register (SAR), and wherein the signal produced by the SAR comprises an end of conversion (EOC) signal.

Example 30: The IC of Example 29, wherein the SAR includes a buffer configured to store the analog input signal, and wherein the internal clock signal is configured to control storing of the analog input signal in the buffer.

Example 31: The IC of any of Examples 28 to 30, wherein the clock generator further comprises a buffer configured to store the internal clock signal.

Example 32: The IC of any of Examples 28 to 31, wherein the gate of the second transistor is further configured to be pre-charged when the external clock signal is high.

Other Variations

Any of the ASICs described herein can be used to drive and control semiconductor devices (for instance, amplifiers and switches) that are used in communication systems, defense systems, automotive systems, etc.

As used herein, when referring to the signal levels, the terms high and low can designate logic high ("1" and logic low ("0").

Although certain examples refer to the use of field-effect transistors (FETs) as switching devices, other transistor types can be used, such as bipolar junction transistors (BJTs) or insulated-gate bipolar transistors (IGBTs). Although certain examples refer to NMOS and PMOS transistors, any n-type or p-type transistor, respectively, can be used.

While certain ASIC implementations are described, any of the circuits or combination of circuits described herein can be implemented in a FPGA.

Features, materials, characteristics, or groups described in conjunction with a particular aspect, embodiment, or example are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The protection is not restricted to the details of any foregoing embodiments. The protection extends to any novel one, or any novel combination, of the features disclosed in this specification (including any accompanying claims, abstract and drawings), or to any novel one, or any novel combination, of the steps of any method or process so disclosed.

While certain embodiments have been described, these embodiments have been presented by way of example only, and are not intended to limit the scope of protection. Indeed, the novel methods and systems described herein may be embodied in a variety of other forms. Furthermore, various omissions, substitutions and changes in the form of the methods and systems described herein may be made. Those skilled in the art will appreciate that in some embodiments, the actual steps taken in the processes disclosed and/or illustrated may differ from those shown in the figures. Depending on the embodiment, certain of the steps described above may be removed, others may be added. For example, the actual steps and/or order of steps taken in the disclosed processes may differ from those described and/or shown in the figure. Depending on the embodiment, certain of the steps described above may be removed, others may be added. For instance, the various components illustrated in the figures and/or described may be implemented as software and/or firmware on a processor, controller, ASIC, FPGA, and/or dedicated hardware. Furthermore, the features and attributes of the specific embodiments disclosed above may be combined in different ways to form additional embodiments, all of which fall within the scope of the present disclosure.

In some cases, there is provided a non-transitory computer readable medium storing instructions, which when executed by at least one computing or processing device, cause performing any of the methods as generally shown or described herein and equivalents thereof.

Any of the memory components described herein can include volatile memory, such random access memory (RAM), dynamic random access memory (DRAM), synchronous dynamic random access memory (SDRAM), double data rate (DDR) memory, static random access memory (SRAM), other volatile memory, or any combination thereof. Any of the memory components described herein can include non-volatile memory, such as magnetic storage, flash integrated circuits, read only memory (ROM), Chalcogenide random access memory (C-RAM), Phase Change Memory (PC-RAM or PRAM), Programmable Metallization Cell RAM (PMC-RAM or PMCm), Ovonic Unified Memory (OUM), Resistance RAM (RRAM), NAND memory (e.g., single-level cell (SLC) memory, multi-level cell (MLC) memory, or any combination thereof), NOR memory, EEPROM, Ferroelectric Memory (FeRAM), Magnetoresistive RAM (MRAM), other discrete NVM (non-volatile memory) chips, or any combination thereof.

Any user interface screens illustrated and described herein can include additional and/or alternative components. These components can include menus, lists, buttons, text boxes, labels, radio buttons, scroll bars, sliders, checkboxes, combo boxes, status bars, dialog boxes, windows, and the like. User interface screens can include additional and/or alternative information. Components can be arranged, grouped, displayed in any suitable order.

Conditional language used herein, such as, among others, "can," "could," "might," "may," "such as," "e.g.," and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without other input or prompting, whether these features, elements and/or steps are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

Disjunctive language such as the phrase "at least one of X, Y, Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than 10% of, within less than 5% of, within less than 1% of, within less than 0.1% of, or within less than 0.01% of the stated amount.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations.

The foregoing description, for purposes of explanation, used specific nomenclature to provide a thorough understanding of the disclosure. However, it will be apparent to one skilled in the art that specific details are not required in order to practice the disclosed embodiments. Thus, the foregoing descriptions of specific embodiments are presented for purposes of illustration and description. They are not intended to be exhaustive or to limit the disclosure to the precise forms disclosed; obviously, many modifications and variations are possible in view of the above teachings. The embodiments were chosen and described in order to best explain the principles of the disclosure and its practical applications, they thereby enable others skilled in the art to best utilize the disclosure and various embodiments with various modifications as are suited to the particular use contemplated. It is intended that the claims as presented herein or as presented in the future and their equivalents define the scope of the protection.

What is claimed is:

1. An integrated circuit (IC) for driving one or more semiconductor devices comprising:
   at least one current sense amplifier configured to:
      receive an input signal corresponding to a current flowing through a semiconductor device, the input signal associated with a first signal range that exceeds a signal range of a low voltage semiconductor integrated circuit; and
      convert the input signal to a voltage signal associated with a second signal range, the second signal range being compatible with the signal range of the low voltage semiconductor integrated circuit; and a control circuitry configured to process the voltage signal and output a control signal for driving the semiconductor device,
  wherein the IC is a low voltage semiconductor integrated circuit.

2. The IC of claim 1, wherein the at least one current sense amplifier and the control circuitry are housed in a single integrated circuit package.

3. The IC of claim 2, wherein the at least one current sense amplifier is configured to be connected to a resistor positioned outside the single integrated circuit package, the resistor being configured to be connected to a terminal of the semiconductor device to facilitate the current to flow across the resistor.

4. The IC of claim 1, wherein the at least one current sense amplifier comprises at least one transistor, a frequency converter, and a low pass filter, and wherein the frequency converter is configured to up convert a noise produced by the at least one transistor and the low pass filter is configured to filter out up converted noise so that the noise is removed from the voltage signal output by the at least one current sense amplifier.

5. The IC of claim 4, wherein the frequency converter comprises a clock source and a mixer, the mixer configured to utilize a clock signal generated by the clock source to up convert the noise produced by the at least one transistor.

6. The IC of claim 4, wherein the noise produced by the at least one transistor comprises low frequency noise.

7. The IC of claim 4, wherein the noise produced by the at least one transistor comprises flicker noise.

8. The IC of claim 1, wherein the semiconductor device comprises a transistor and the input signal corresponds to a current through a drain or gate of the transistor.

9. The IC of claim 8, wherein the control signal is provided to the gate of the transistor to control an operating mode of the transistor.

10. The IC of claim 1, wherein the semiconductor device comprises a radio frequency (RF) amplifier.

11. The IC of claim 10, wherein the RF amplifier comprises a Gallium Nitride (GaN) amplifier.

12. A method for driving one or more semiconductor devices using an integrated circuit (IC), the method comprising:
  by at least one current sense amplifier:
    receiving an input signal corresponding to a current flowing through a semiconductor device, the input signal associated with a first signal range that exceeds a signal range of a low voltage semiconductor integrated circuit; and
    converting the input signal to a voltage signal associated with a second signal range, the second signal range being compatible with the signal range of the low voltage semiconductor integrated circuit; and
  by a control circuitry:
    processing the voltage signal and outputting a control signal for driving the semiconductor device,
      wherein the IC is a low voltage semiconductor integrated circuit.

13. The method of claim 12, wherein the at least one current sense amplifier is configured to be connected to a resistor positioned outside a single integrated circuit package that houses the at least one current sense amplifier and the control circuitry, the resistor being configured to be connected to a terminal of the semiconductor device to facilitate the current to flow across the resistor.

14. The method of claim 12, wherein the at least one current sense amplifier comprises at least one transistor, a frequency converter, and a low pass filter, and wherein the frequency converter is configured to up convert a noise produced by the at least one transistor and the low pass filter is configured to filter out up converted noise so that the noise is removed from the voltage signal output by the at least one current sense amplifier.

15. The method of claim 14, wherein the frequency converter comprises a clock source and a mixer, the mixer configured to utilize a clock signal generated by the clock source to up convert the noise produced by the at least one transistor.

16. The method of claim 14, wherein the noise produced by the at least one transistor comprises low frequency noise.

17. The method of claim 14, wherein the noise produced by the at least one transistor comprises flicker noise.

18. The method of claim 12, wherein the semiconductor device comprises a transistor and the input signal corresponds to a current through a drain or gate of the transistor, and wherein the control signal is provided to the gate of the transistor to control an operating mode of the transistor.

19. The method of claim 12, wherein the semiconductor device comprises a radio frequency (RF) amplifier.

20. The method of claim 19, wherein the RF amplifier comprises a Gallium Nitride (GaN) amplifier.

* * * * *